United States Patent
Sahara et al.

(10) Patent No.: US 6,891,870 B2
(45) Date of Patent: May 10, 2005

(54) DISTRIBUTED FEEDBACK LASER FOR ISOLATOR-FREE OPERATION

(75) Inventors: Richard T. Sahara, Watertown, MA (US); Angela Hohl-Abichedid, Beverly, MA (US); Hanh Lu, North Andover, MA (US)

(73) Assignee: Corning Lasertron, Inc., Bedford, MA (US)

( * ) Notice: Subject to any disclaimer, the term of this patent is extended or adjusted under 35 U.S.C. 154(b) by 564 days.

(21) Appl. No.: 10/037,461

(22) Filed: Nov. 9, 2001

(65) Prior Publication Data

US 2003/0091081 A1 May 15, 2003

(51) Int. Cl.[7] ............................................. H01S 3/08
(52) U.S. Cl. ............................ 372/45; 372/43; 372/46
(58) Field of Search ..................................... 372/43, 46

(56) References Cited

U.S. PATENT DOCUMENTS

| | | | | |
|---|---|---|---|---|
| 4,719,636 | A | | 1/1988 | Yamaguchi ................. 372/50 |
| 5,272,714 | A | | 12/1993 | Chen et al. .................... 372/43 |
| 5,347,526 | A | | 9/1994 | Suzuki et al. ................. 372/20 |
| 5,548,607 | A | * | 8/1996 | Tsang ........................... 372/50 |
| 6,028,881 | A | | 2/2000 | Ackerman et al. ............ 372/75 |
| 6,108,469 | A | | 8/2000 | Chen ............................ 385/24 |
| 6,122,299 | A | * | 9/2000 | DeMars et al. ............... 373/20 |
| 6,400,744 | B1 | * | 6/2002 | Capasso et al. ............... 372/96 |
| 6,628,864 | B2 | * | 9/2003 | Richardson et al. .......... 385/37 |
| 2003/0043878 | A1 | * | 3/2003 | Funabashi et al. ............ 372/96 |
| 2003/0095737 | A1 | * | 5/2003 | Welch et al. ................. 385/14 |

OTHER PUBLICATIONS

Huang et al., Isolator–Free 2.5–Gb/s 80–km Transmission by Directly Modulated lamda/8 Phase–Shifted DFB–LDs Under Negative Feedback Effect of Mirror Loss, Mar. 2001, IEEE Photonics Technology Letters, vol.13, pp. 245–247.*

Kazmierski, Christophe, et al., "1.5μm DFB Lasers with New Current–Induced Gain Gratings," *IEEE Journal of Selected Topics in Quantum Elec.*, 1(2): 371–374 (1995).

Nakano, Yoshiaki, et al., " Reduction of Excess Intensity Noise Induced by External Reflection in a Gain–Coupled Distributed Feedback Semiconductor Laser," *IEEE Journal of Quantum Electronics*, 27(6): 1732–1735 (1991).

Huang, Yidong,et al., "Isolator–Free 2.5 Gb/s 80–km Transmission by Directly Modulated λ/8 Phase–Shifted DFB–LDs Under Negative Feedback Effect of Mirror Loss," *IEEE Photonics Technology Letters*, 13(3): 245–247 (2001).

Thedrez, B., et al., "1.3μm tapered DFB lasers for isolator–free 2.5 Gbits all–optical networks," OPTO+, Groupement d'Intérêt Economique, Alcatel Corporate Research Center, Marcoussis, France.

(Continued)

*Primary Examiner*—Don Wong
*Assistant Examiner*—Dung (Michael) T Nguyen
(74) *Attorney, Agent, or Firm*—Juliana Agon

(57) ABSTRACT

An integrated semiconductor device comprising a laser on a substrate, the laser having an active layer and a current-induced grating, such as a current-injection complex-coupled grating, within a laser cavity producing a single-mode output light signal at high data rates (>622 Mb/sec) in isolator-free operation. The grating has a coupling strength product κL greater than 3, where κ is the coupling coefficient and L is the length of the laser cavity. In certain embodiments, the laser is a distributed feedback (DFB) laser that emits light at a wavelength of about 1.5 μm. The strong current-induced grating prevents mode hopping between multiple degenerate Bragg modes. The laser is also characterized by excellent immunity from optical feedback, and can be operated without an isolator at high data rates.

33 Claims, 13 Drawing Sheets

OTHER PUBLICATIONS

Xing–sha, Zhou and Peida, Ye, "Intensity Noise of Semiconductor Laser In Presence Of Arbitrary Optical Feedback," *Electronics Letters*, 25(7): 446–447 (1989).

Schunk, N. and Petermann, K., " Measured Feedback–induced Intensity Noise for 1.3 μm DFB Laser Diodes, " *Electronics Letters*, 25(1): 63–64 (1989).

Favre, F., "Sensitivity to External Feedback For Gain-Coupled DFB Semiconductor Lasers," *Electronics Letters*, 27(5): 433–435 (1991).

Nakano, Y., et al., "Resistance to External Optical Feedback in a Gain–Coupled Semiconductor DFB Laser," University of Tokyo, Bunkyo–ku, Tokyo 113, Japan.

"QLM6S891, 2mW 1625nm OSC Source DFB Laser", Product Brochure, Corning Incorporated, One Riverfront Plaza, Corning, NY 14831–0001 (2001).

* cited by examiner

DISTRIBUTED FEEDBACK LASER FOR ISOLATOR-FREE OPERATION

RELATED APPLICATION

This application is related to U.S. patent application Ser. No. 10/037,458 entitled TUNABLE LASER DEVICE FOR AVOIDING OPTICAL MODE HOPS, by Richard Sahara, Randal Salvatore, and Hanh Lu, filed on even date herewith and commonly owned by the owner of this application. The entire teachings of the above application are incorporated herein by reference.

BACKGROUND OF THE INVENTION

Semiconductor laser devices are widely used in fiber optic communication systems. Distributed feedback (DFB) lasers have proven particularly successful in achieving narrow-linewidth, single-mode light for high-speed data transmission applications. The DFB device employs a Bragg grating structure for providing improved selectivity in the output light mode. The grating structure introduces a periodic modulation of the refractive index or gain within the laser cavity, thus facilitating single longitudinal mode oscillation within the cavity.

For low-error performance, conventional DFB lasers require optical isolation to prevent optical feedback, including external reflections, from coupling back into the laser chip. In a conventional DFB laser, the grating structure promotes the formation of two standing waves in the cavity (180° out of phase with each other), often referred to as the degenerate Bragg modes. In order to achieve single-mode, single-wavelength emission, the degeneracy must be "broken" so that only one of the Bragg modes will be pumped. Typically, the degeneracy is broken by reflections from the facets of the laser cavity, which strengthen one mode relative to the other, in essence "selecting" a single mode to lase. However, reflections from sources external to the chip may serve to break the degeneracy of the Bragg modes in an undesirable way, causing the laser output light to jump intermittently between multiple Bragg modes. Optical isolators are therefore required in order to maintain the single-mode, single-wavelength output light desired for optical communication. The need to shield the device from external optical feedback is particularly acute at high-data rates where dispersion effects may render long-span transmission impossible.

Typical optical isolators for use with DFB lasers include a pair of polarizers with an intervening Faraday rotator, or a polarization-maintaining pigtailed optical isolator, which is a passive device that allows light to travel through a fiber in one direction only. These isolators add significant cost to fiber optic communication systems, and complicate the construction of multifunction integrated devices, such as dense WDM systems employing compact multichannel, multiwavelength sources.

SUMMARY OF THE INVENTION

An integrated semiconductor device of the present invention comprises a laser on a substrate, the laser having an active layer and a current-induced grating, such as a current-injection complex-coupled grating, within a laser cavity producing a single-mode output light signal at high data rates (>622 Mb/sec) in isolator-free operation. The grating has a coupling strength product $\kappa L$ greater than 3, where $\kappa$ is the coupling coefficient and L is the length of the laser cavity. In certain embodiments, the laser is a distributed feedback (DFB) laser that emits light at a wavelength of about 1.5 $\mu$m, or in other cases, at a wavelength about 1.3 $\mu$m.

The coupling strength product, $\kappa L$, is a measurement of the grating strength in the DFB laser, where $\kappa$ (cm$^{-1}$) is a coupling coefficient relating to the extent that light is coupled backward over the distributed length of the cavity, and L (cm) is the length of the cavity. Conventionally, $\kappa L$ products between 0.5 and 1.5 are preferred for most DFB lasers, as weaker values will not provide the selectivity for single-mode output, and stronger values, it is believed, cause the DFB to lase in multiple degenerate Bragg modes.

According to one aspect, high-yield semiconductor laser devices with large $\kappa L$ products (e.g. >3) are provided that use a complex-coupled grating structure. In this device, the grating material introduces a difference in the index of refraction of the laser material. The grating structure is also located just above the active region, causing the injection of current, and therefore the gain in the active region to be modulated spatially in the direction of light propagation. The longer wavelength of the two Bragg modes is selected by the current-induced gain modulation, and not by the reflection of the cleaved facets. The grating coupling strength is free to be made very strong relative to reflection from the cleaved facets and external sources.

The laser device of the present invention is further characterized by excellent immunity from external optical feedback, which permits the laser to be operated in a single longitudinal mode at high data rates without the use of complicated and costly optical isolators. More particularly, the device of the present invention manages to eliminate the problem of mode hopping between degenerate Bragg modes without resorting to conventional optical isolation schemes. The removal of the optical isolator is not only a significant cost reduction, it also simplifies the construction of many multifunction integrated devices.

The integrated semiconductor device of the invention may include a directly-modulated laser, or a laser coupled with an external modulator for forming the optical signals. For instance, the device may comprise a laser and an electroabsorption modulator (EML), or a Mach Zehnder modulator, integrated on a single substrate.

The invention also relates to a method for fabricating an integrated semiconductor device, comprising forming an active layer above a substrate, and forming a current-induced grating above the active layer, so as to produce a laser cavity emitting a single-mode output light signal at a high data rate in isolator-free operation.

The invention further relates to an optical communication device comprising a semiconductor laser having an active layer and a current-induced grating that form a laser cavity producing a single-mode output light signal at a high data rate, an optical fiber for receiving the output light signal, and optics for isolator-free coupling of the output light into the optical fiber. The coupling optics can include, for instance, a collimating lens for collimating the light emitted by the laser and a coupling lens for focusing the light into the optical fiber. In other embodiments, a fiber pigtail arrangement may be employed, where the optical fiber is connected to the laser device at the output facet, and the coupling optics includes an endface lens at the connecting end of the optical fiber.

BRIEF DESCRIPTION OF THE DRAWINGS

FIGS. 3A, 3B to 5A, 5B illustrate side and front facet views, respectively, of process steps for fabricating a DFB laser device of the present invention;

Figure 1:
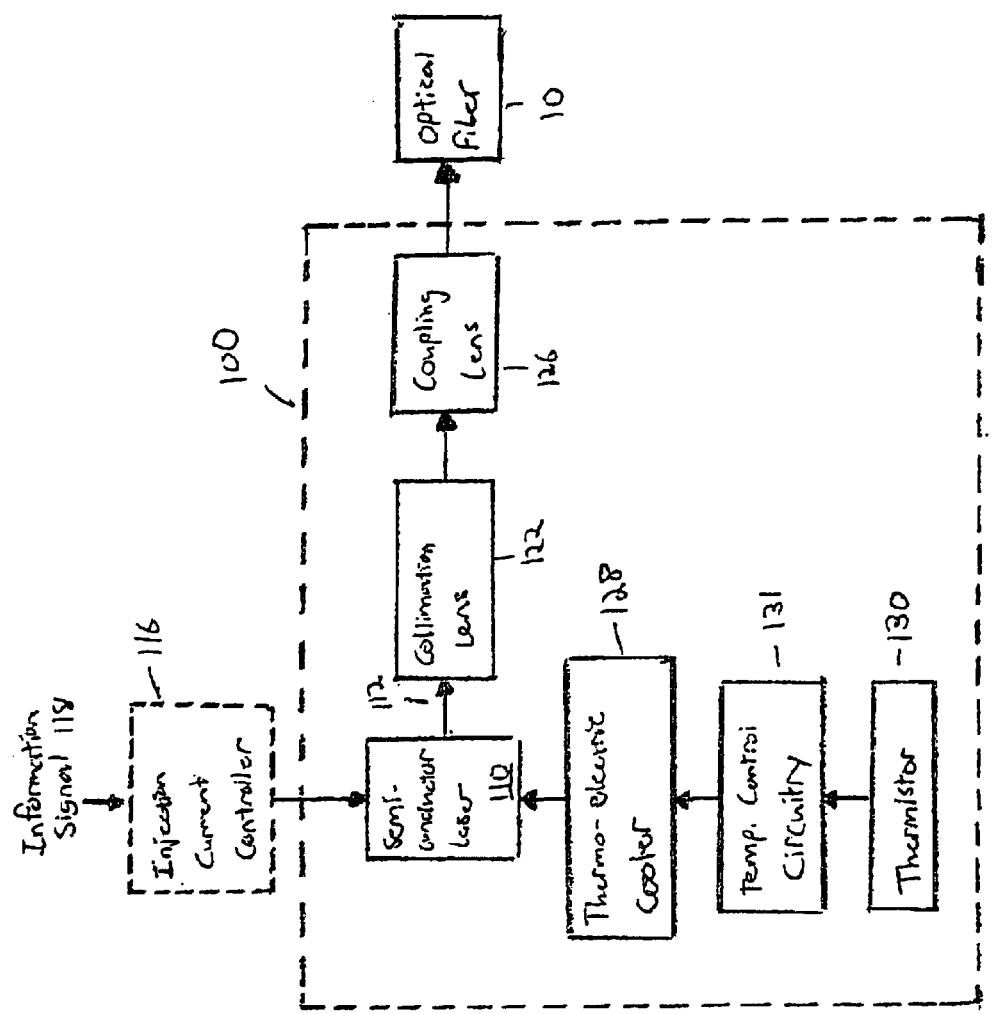
FIG. 1 is a block diagram showing an optical communication device according to the present invention.

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

FIG. 1 is a block diagram of an optical communication device 100, which has been constructed according to the principles of the present invention. As is common in these devices, a semiconductor laser 110 generates an optical signal 112. In one embodiment, the laser is a distributed feedback laser (DFB) that emits light having a wavelength of approximately 1550 nm.

Information is encoded into the optical signal 112 by modulating the laser's injection current in response to an information signal 118. Specifically, an injection current controller 116, typically external to the communications device 100, receives the information signal 118 from the device 100. The controller 116 modulates the injection current of the laser 110 both to encode the information signal and maintain nominal, predetermined output optical powers to conform with both the device's damage thresholds and user design specifications.

A thermo-electric cooler 128 maybe provided for maintaining a constant, controlled operating temperature, and thus a stable wavelength for the optical signal 112. The thermo-electric cooler is under the control of temperature control circuitry 131, which modulates the operation of the thermo-electric cooler 128 to heat or cool the laser in response to temperature signals received from thermistor 130.

In addition to the directly-modulated DFB laser embodiment described above, the invention also applies to other modulated laser light systems. For example, in alternative embodiments, the laser can be replaced with a laser diode and discrete modulator, such as an electroabsoption modulator or a Mach Zehnder modulator. Typically, in such systems, the laser runs nominally in a continuous wave mode with the information signal 118 being provided to the modulator.

Exemplary embodiments of an integrated electroabsorption modulated laser (EML) device, as well as an electroabsorption modulated partial grating laser (EMPGL) device, wherein the laser diode and modulator are integrated on a single substrate, are disclosed in commonly-owned U.S. patent application Ser. No. 09/809,725, entitled "ELECTROABSORPTION MODULATED LASER," by Randal A. Salvatore, Richard P. Sahara and Hanh Lu, the entire teachings of which are incorporated herein by reference.

In FIG. 1, the optical signal 112 is transmitted via an optical fiber 10 that is external to the communications device 100. Collimating lens 122 and coupling lens 126 are used to couple the optical signal 112 into the optical fiber for transmission in a typical embodiment.

According to one aspect of the present invention, the communications device 100 operates at a high rate of data transmission (>622 Mb/sec) without the use of an optical isolator. In conventional optical communication systems, an optical isolator is disposed between the output facet 114 of the laser 110 and the optical fiber 10, typically between the collimating lens 122 and coupling lens 126. The optical isolator is required to prevent undesirable optical feedback, including unintended reflections, from entering the laser chip and interfering with device performance. In the present invention, however, there is no optical isolator, and the output light from the laser device is directly coupled by lenses 122, 126 into the optical fiber.

In other embodiments, alternative isolator-free optical coupling systems can be employed. For instance, a fiber-pigtail can be connected to the output facet of the laser, and the output light can be directly coupled into the optical fiber by an endface lens.

Figure 2:
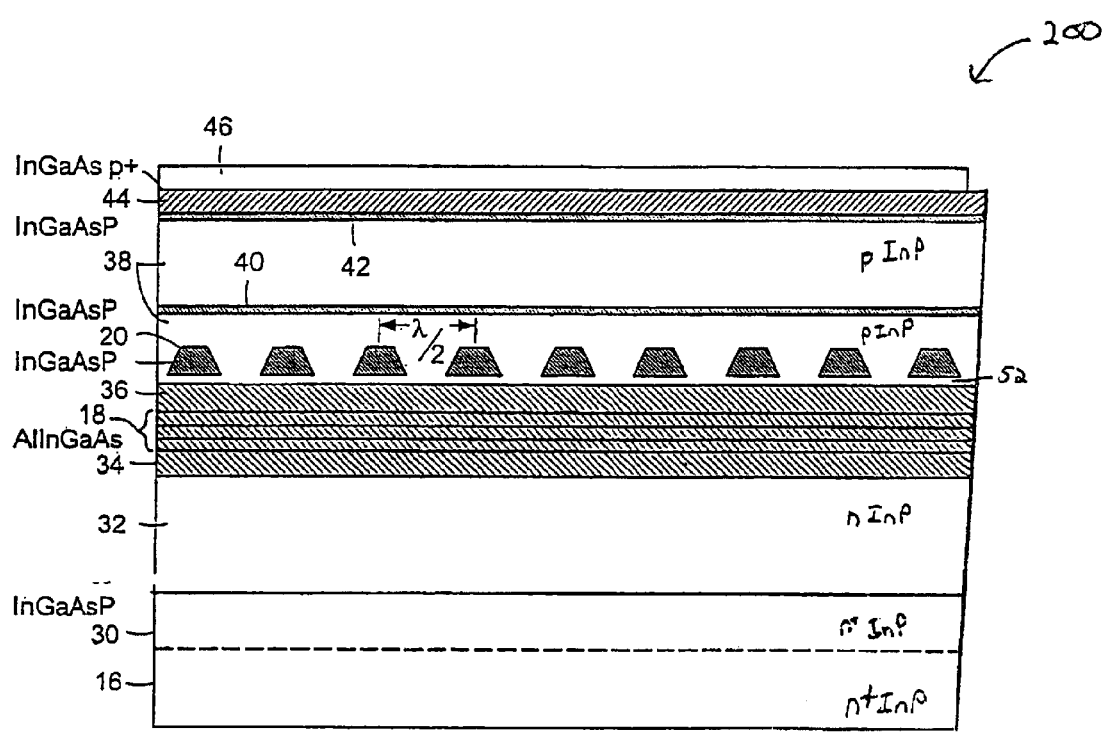
FIG. 2 is a cross-sectional view of a distributed feedback (DFB) laser device with a current-induced grating according to the present invention.

Turning now to FIG. 2, an exemplary embodiment of a complex-coupled ridge waveguide DFB laser device 200 of the present invention is illustrated. FIG. 2 shows a cross-sectional view of the laser device 200 taken along the length of the ridge waveguide. The device is constructed on a substrate 16, which, according to this embodiment, comprises n+-type indium phosphide (InP). Above the substrate 16 is buffer layer 30 that is n+-type InP.

In succession above the buffer layer 30 is a lower cladding layer 32, a lower carrier confinement layer 34, an active layer 18, an upper carrier confinement layer 36 and an upper cladding layer 38. The lower and upper cladding layers 32, 38 provide optical confinement and are preferably of InP of n-type and p-type, respectively. The lower and upper carrier confinement layers 34, 36 confine the holes and electrons in the active layer 18 and are preferably of aluminum indium gallium arsenide (AlInGaAs). The active layer 18 is a multiple quantum well (MQW) structure which is also of AlInGaAs. The MWQ structure includes a succession of wells and potential barriers ranging from 4 to 20, but preferably about 5. The strain of the wells and barrier materials is compensated to improve the gain, carrier injection efficiency, and material reliability.

Alternative materials for forming the active layer 18 include InGaAsP, InGaAs, and AlGaNAs.

A periodic complex-coupled Bragg grating structure 20 is formed in the upper cladding layer 38. The Bragg grating is a three level structure of InP/InGaAsP/InP, periodically spaced along the length of the cavity. In this example, the periodic spacing is $\lambda/2n$, where $\lambda$ is the emission wavelength of the laser and n is the effective index of refraction of the optical mode.

The periodic Bragg grating is a complex coupled grating because the grating structure provides periodic modulation of both refractive index and gain within the laser cavity. The refractive index modulation is introduced by the selection of the narrow band gap (e.g. 1.1 $\mu$m) grating material 20, having a different index than the surrounding material 38. The gain modulation results from the difference in conductivity, obtained by dopant or band gap, between InGaAsP grating structure and the surrounding InP cladding layer. As this grating structure is located just above the active layer 18, current injection causes the gain of the active layer to be modulated spatially in the direction of light propagation. This selectivity of current flow causes only one of the degenerate Bragg modes to be pumped. In the embodiment shown in FIG. 2, the spacing 52 between the grating and upper carrier confinement layer is on the order of 0.1 $\mu$m to provide the current-injection complex-coupling.

The resulting layered structure of the laser 200 provides a DFB laser that confines light generated in the active layer 18 primarily within a resonant cavity including the active, carrier confinement, Bragg grating and cladding layers. An upper etch-stop layer 40 of InGaAsP, formed in the upper cladding layer 38, is used to define the depth of the ridge waveguide.

Above the upper cladding layer 38 is provided in succession a band gap transition layer 42 of InGaAsP, an electrical contact layer 44 of p+-type InGaAs, and metal contact 46. In operation, contact 46 is forward-biased.

Generally, the current-induced grating in the present invention is significantly stronger than in conventional DFB devices, particularly index-coupled devices. The strong grating provides robust, single-mode output, while also preventing external feedback from breaking the degeneracy of the Bragg modes in an undesirable way. Depending on the application, the $\kappa$L product for the grating may be greater than 3 or 4, or even larger. A complex-coupled DFB with $\kappa$L=7, for example, should show two orders better immunity to stray reflections than the more typical DFB with $\kappa$L=1.5. It is also possible to have relatively high output power even with a very strong grating (e.g. $\kappa$L ~6 or 7) and where the facet output power is only a fraction of the power in the center of the laser. In practical terms, the grating strength is limited by its construction of the output slope efficiency. This limit is similar to the low slope efficiency of Fabry Perot lasers with very high reflective facets.

Current-induced complex-coupled DFB lasers, such as the device of FIG. 2, are also advantageous with respect to many gain-coupled devices in that the grating structure of the present invention is fabricated above the active layer 18, without requiring an etch into the active layer, or another process which might detrimentally affect the active portion of the laser. In the DFB of FIG. 2, for example, the aluminum in the AlInGaAs active region is extremely reactive to air, and an etching process into the active region introduces a great risk of contamination of this sensitive structure. According to the present invention, the grating may be formed above the active layer 18, while the thin layer of InP 52 provides protection for the active region. Many gain-coupled devices, by contrast, utilize an etched or corrugated active layer for providing the periodic gain modulation, where the active region cannot be similarly protected during the grating fabrication process.

Process steps for fabricating the complex-coupled DFB laser device of FIG. 2 are now described. Reference is made to FIGS. 3A, 3B to 5A, 5B in the following description of process steps wherein side (A) and front (B) facet views are provided.

Figure 3A:
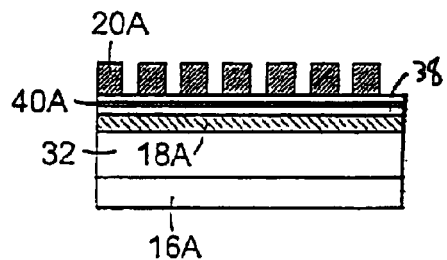
Figure 3B:
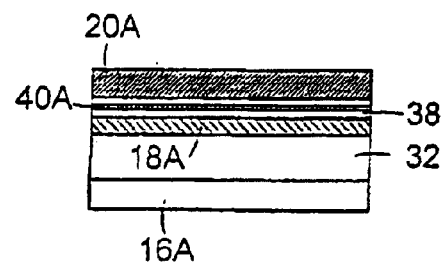

As shown in FIGS. 3A, 3B, an InP substrate and buffer layer, jointly designated 18A, lower cladding layer 32, active region including upper and lower carrier confinement layers and active layer, jointly designated 18A, and upper cladding layer 38 are formed using an epitaxial growth process, such as metalorganic chemical vapor deposition (MOCVD), using material compositions described above with reference to FIG. 2. A quaternary (InGaAsP) 1.1 $\mu$m layer 40A for the grating structure is formed on the upper cladding layer, followed by a thin layer of InP.

The grating is fabricated by depositing a photoresist, and exposing the photoresist to a holographic pattern to provide spaced portions 20A for producing the grating. Following this step, a timed wet etch is used to make the grating, and the photoresist is then stripped.

Figure 4A:
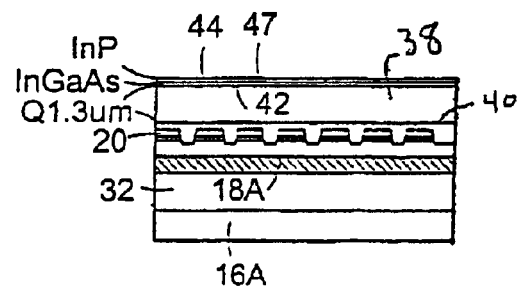
Figure 4B:
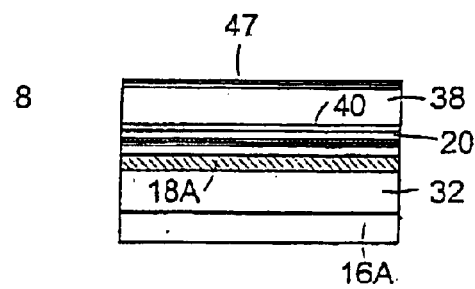
Figure 5A:
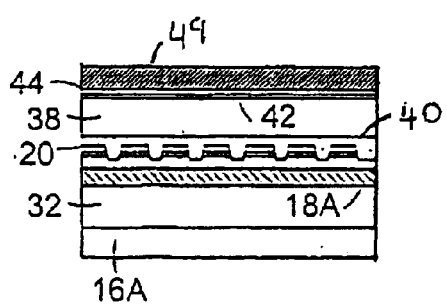
Figure 5B:
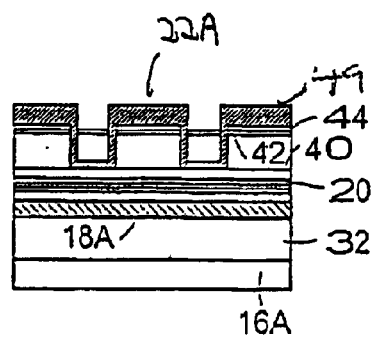

As shown in FIGS. 4A, 4B, overgrowth begins with InP 38 followed by an upper etch-stop layer 40 which is a quarternary (InGaAsP) 1.3 $\mu$m layer above the grating 20, followed by an additional layer of InP 38, a transition layer 42 of InGaAsP, and electrical contact layer 44 of p+-type InGaAs. Above electrical contact layer 44 may be grown a protection layer 47 of InP.

The ridge waveguide is defined by first removing the protection layer 47 and depositing an $SiO_2$-A layer and photoresist. The photoresist is exposed with a ridge mask followed by development and stripping of the photoresist. Using a dry etch ($CH_4/H_2/Ar$), the photoresist pattern is etched down into the upper cladding layer 38. A wet etch using $HCl:H_3PO_4$ (1:3) is then done down through upper etch-stop layer 40 to further define the ridge 22A.

P-metals (e.g., Ti 400 Å/Pt 1000 Å/Au 2500 Å) are deposited over InGaAs contact layer 44. An electroplate mask can be used to plate about 1.5 $\mu$m Au.

The device is wafer-thinned to facilitate cleaving, and then receives Au/Sn n-contact metal. The device is then annealed to 410° C., is cleaved into bars and is facet coated.

Experimental results for complex-coupled DFB laser devices in isolator-free operation in accordance with the present invention are now described. More particularly, the performance of 1550 nm DFB laser diode modules were examined and characterized with up to 20% back reflection into the modules. The lasers included current-induced complex-coupled grating structures having a strong coupling coefficient of $\kappa$=51 cm$^{-1}$. In general, through bit error rates $10^{-10}$, no error floor was found and the dispersion penalty remained less than 2.0 dB for a data rate of 2.5 Gb/sec. over 100 km of SMF-28.

The subject devices were fabricated in accordance with the process steps described above. In particular, four ridge waveguide laser devices ridge were formed with standard dry and wet processes, cleaved and given a 2% AR coating on the front facet and left as cleaved on the back facet. Modules 1, 2 and 3 were first assembled with an optical train consisting of the chip, lens, isolator, lens and angle cleaved fiber. After initial characterization, the isolators were removed, and the chips were tested in detail with the remainder of the optical path intact. Module 4 was assembled with light from the chip coupled directly into a conical tip, lensed fiber. For both configurations, the coupling efficiencies of light into the single mode optical fiber was approximately 60%.

Figure 6:
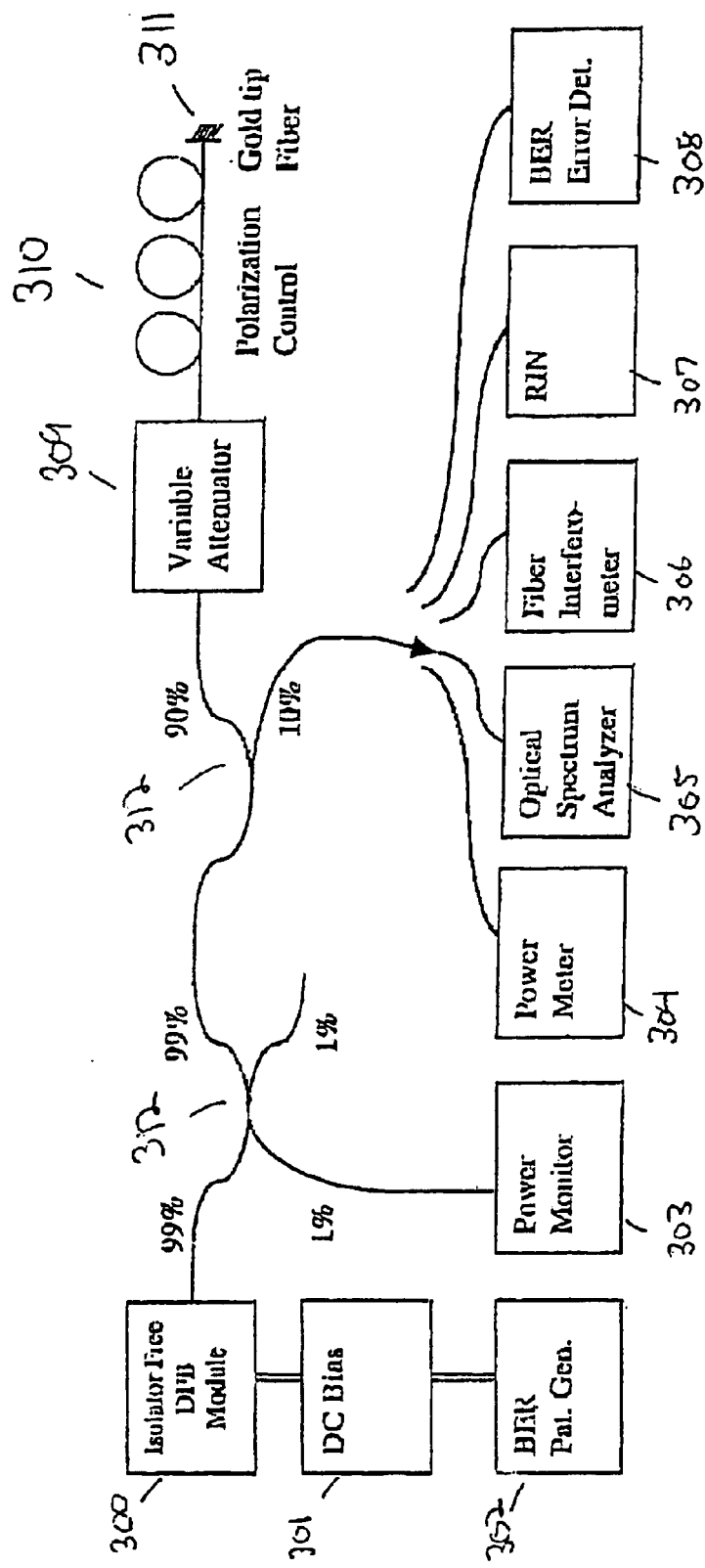
FIG. 6 is a schematic block diagram of a test system for DFB laser modules in isolator-free operation.

A schematic of the test system is shown in FIG. 6, including DFB module 300, DC bias source 301, bit error rate pattern generator 302, power monitor 303, power meter 304, optical spectrum analyzer 305, fiber interferometer 306, relative intensity noise detector 307, bit error rate detector 308, variable optical attenuator 309, polarization controller 310, and gold tip fiber 311. The back reflection through the fiber power splitters 312, variable optical attenuator 309, polarization controller and the gold tipped fiber 311 was carefully calibrated. In this context, the back reflection is referenced relative to the module fiber power rather than the chip facet power. The fiber polarization controller 310 was adjusted so that the polarization of the feedback was parallel to the TE mode which the modules normally emit so as to maximize the interaction of the reflected light with the laser at threshold. The distance from the laser to the back reflection source is approximately 8.7 meters in this system. Angled connectors were used to avoid unintended back reflections. With no back reflections, the CW linewidth of these devices is much less than 1 MHz at 1 mW fiber power, giving a coherence length in optical fiber of better than 200 meters. Therefore, the reflection source is within the coherence length of the original isolated laser module. Back reflections up to 20% were studied since this corresponds to the maximum reflection from an air gap at a connector.

Figure 7:
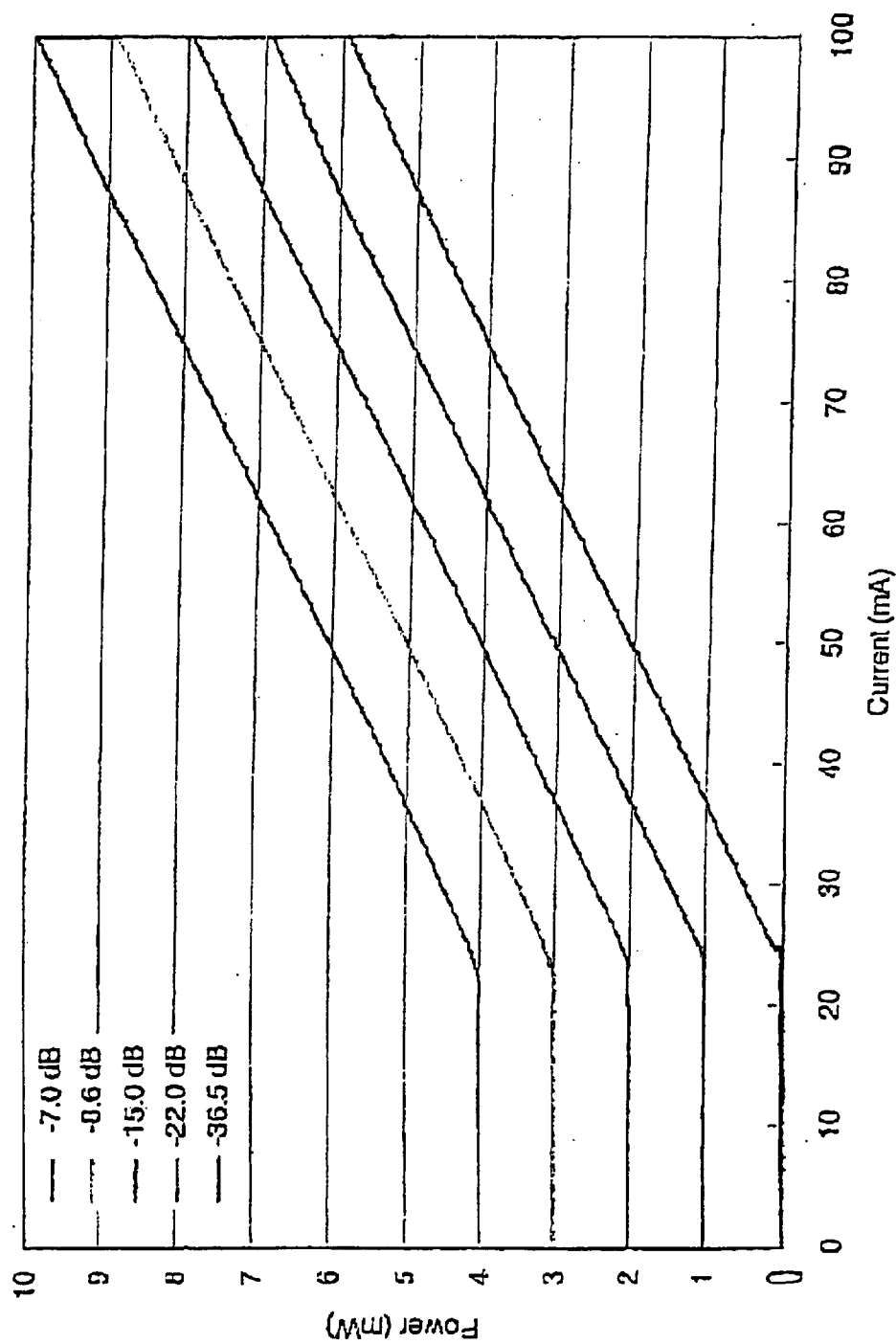
FIG. 7 shows power versus intensity curves for a first DFB module in isolator-free operation at different optical feedback levels.
Figure 8:
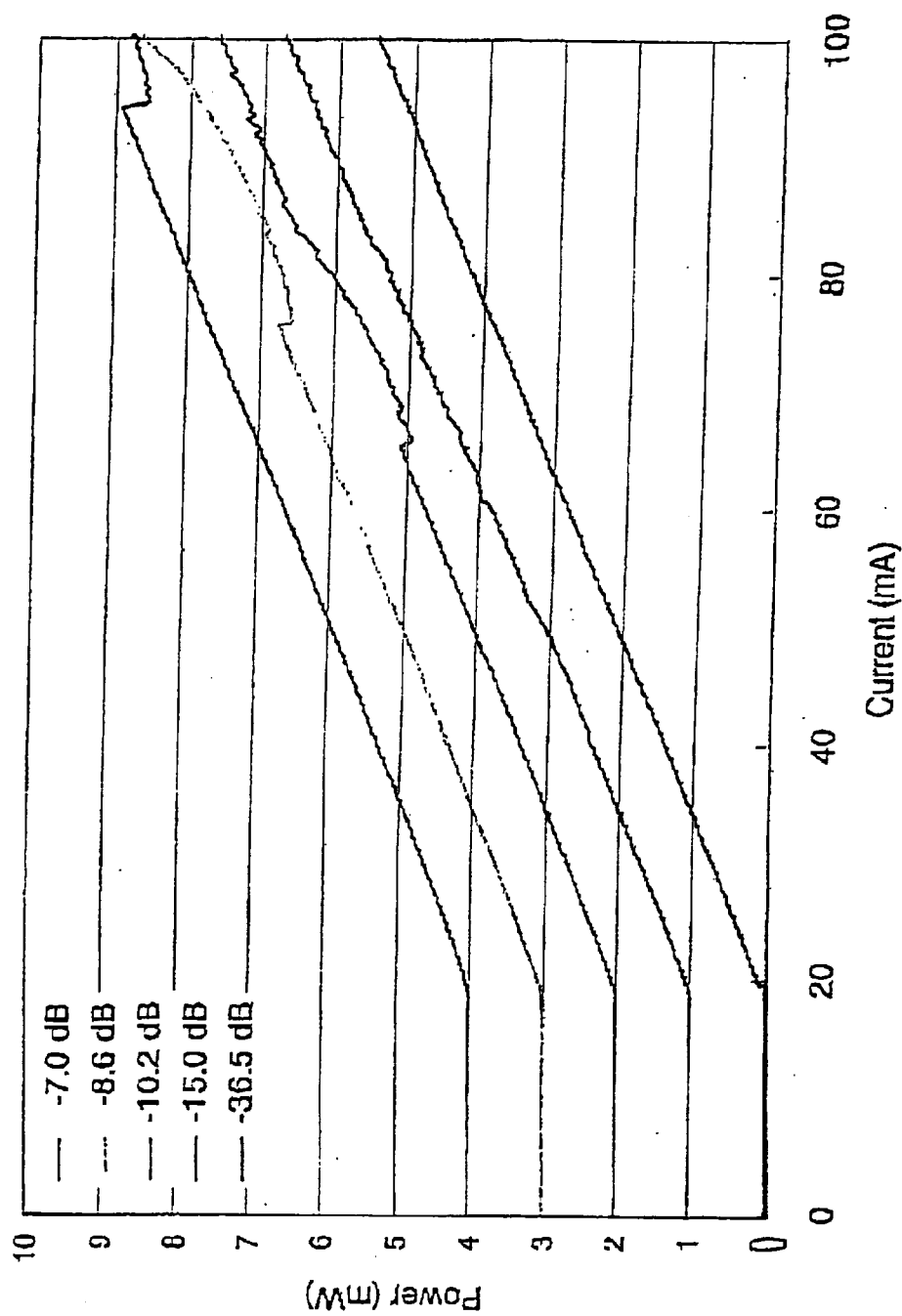
FIG. 8 shows power versus intensity curves for a second DFB module in isolator-free operation at different optical feedback levels.

It can be seen from FIG. 7 that no kinks were found in the power versus current curves for Module 4. The curves with −36.5, −15, −10.2, −8.6 and −7.0 dB of feedback are offset vertically in 1 mW increments for clarity. The threshold current of 24.1 mA was unchanged from −36.5 dB to −22 dB feedback, while it decreased 1.2 mA as the feedback was increased from −22 dB to −7.0 dB. FIG. 8 shows the power versus current curve for Module 1 with significant kinks for the curves with large amounts of back reflection. The kink is consistent with the transition from a single external cavity longitudinal mode to a regime with a multiple external cavity modes. In spite of the kink, the dispersion penalty performance with high back reflection was still surprisingly good as presented below.

Figure 9:
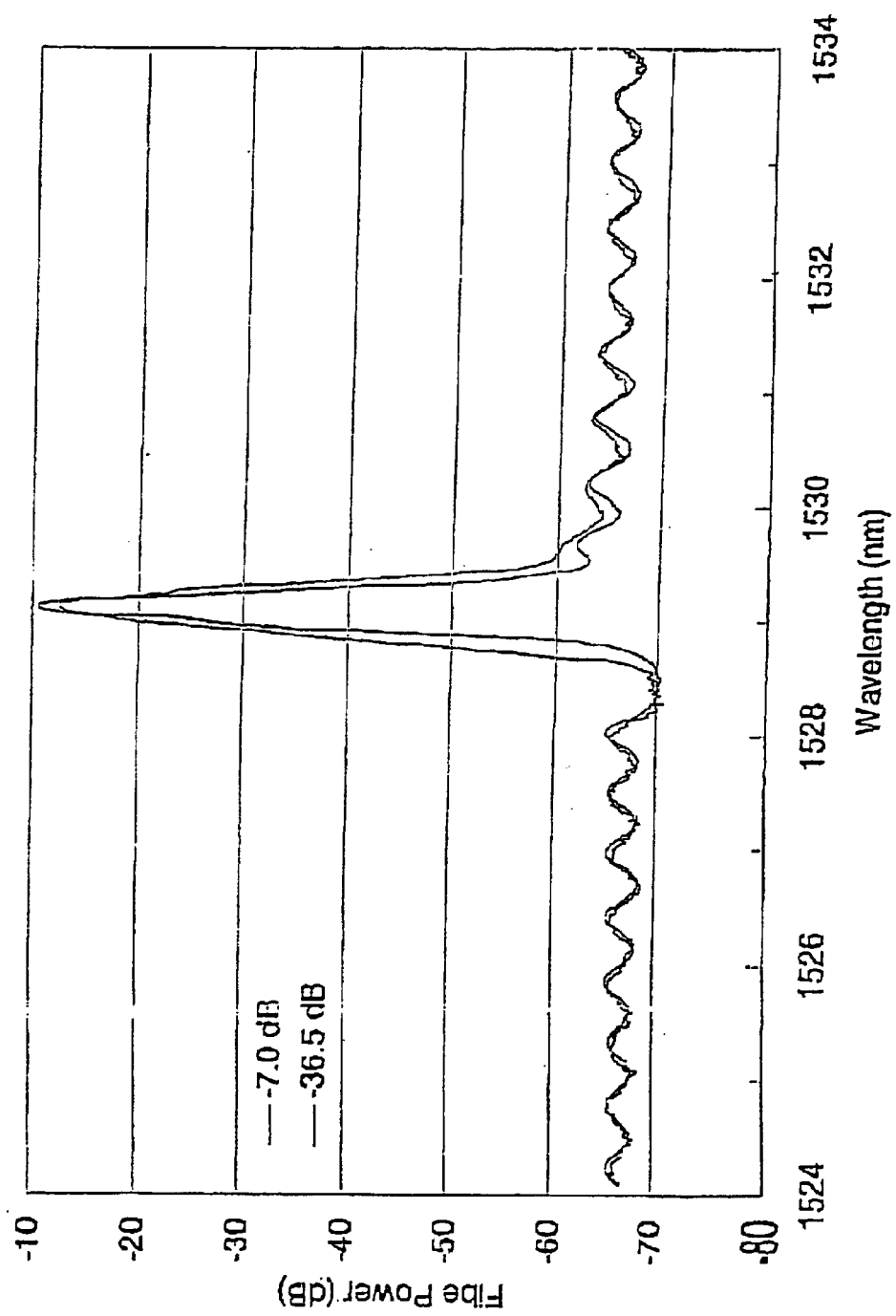
FIG. 9 shows the output spectrum for a DFB module in isolator-free operation at two optical feedback levels.
Figure 10:
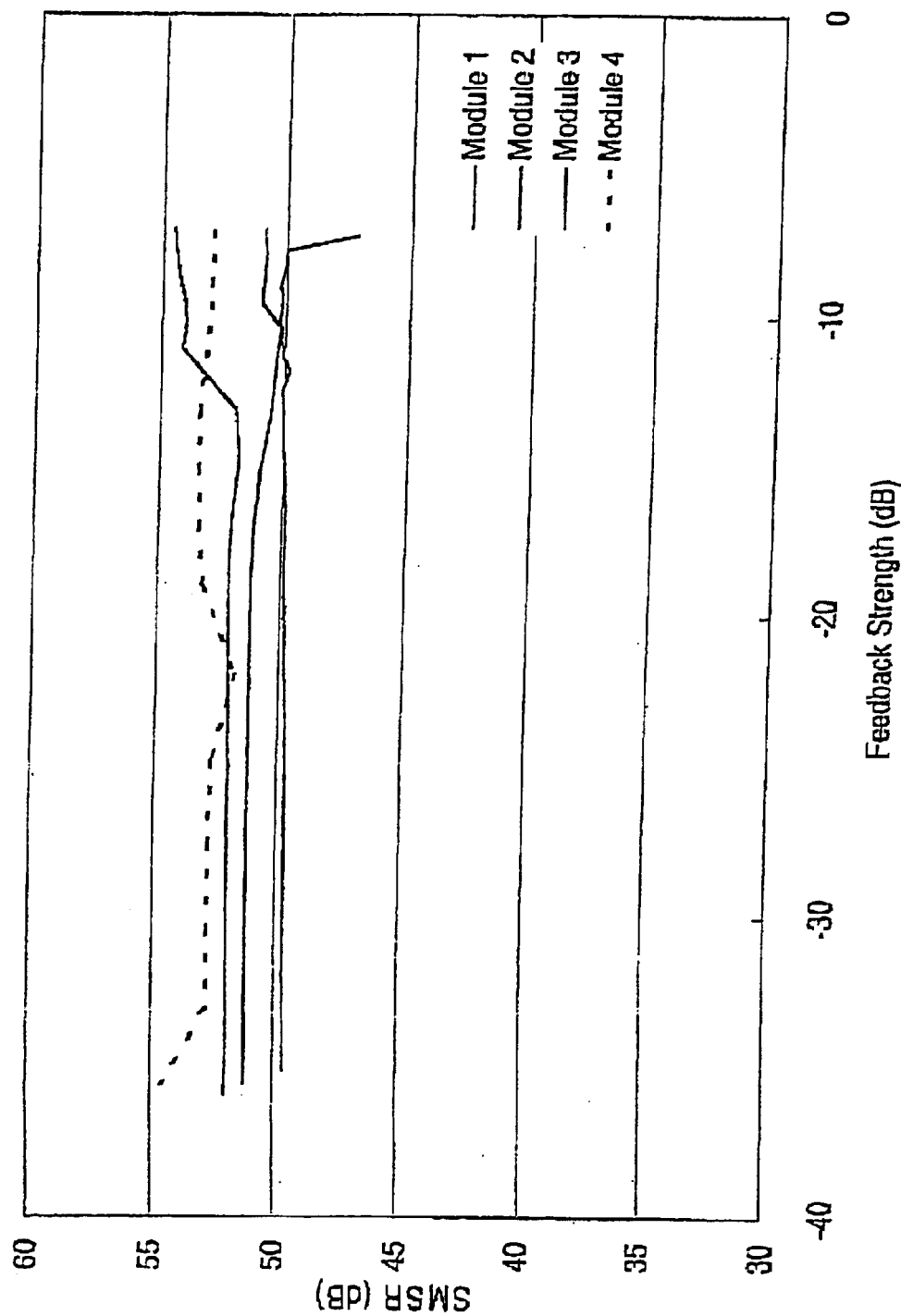
FIG. 10 shows the side mode suppression ratio (SMSR) for DFB modules in isolator-free operation as a function of optical feedback.

The spectrum of Module 4 in FIG. 9 shows little change with optical feedback. This was observed in all the devices as indicated in FIG. 10 plotting the side mode suppression ratio (SMSR) at 1 mW as a function of back reflected power. Due to the strong complex coupled grating, the devices always operated with an SMSR well above 45 dB. The spectrum was carefully studied near the discontinuities in the P-I curve and various effects were ruled out. Because of the difference in effective refractive index between the lowest and second lowest transverse modes, the second lowest transverse mode would be expected in the spectrum about 6 nm shorter in wavelength than the main peak, but this was not observed. The complex coupled gratings kept the devices locked on the long wavelength side of the 1.2 nm stop band as shown in FIG. 9. This stop band corresponds to a grating strength of 51 cm$^{-1}$ giving κL=3.1. Also, no mode hopping between the two Bragg modes was observed. The main peak was not pulled between Fabry Perot modes spaced 0.6 nm apart. Although the submount temperature was set at 25° C., the center wavelength shifted evenly at a rate of 0.00585 nm/mA from localized heating in the chip relative to the monitoring thermistor. From threshold current to 100 mA, the localized heating resulted in a gradual 0.47 nm peak wavelength shift. Mode hopping between external cavity modes separated by 0.000104 nm (11.4 MHz) was beyond the 0.1 nm resolution limit of the optical spectrum analyzer. However, the 0.47 mn of tuning from the localized heating would tune across some 4500 external cavity modes rather than the single discontinuity observed in the P-I curve.

Figure 11:
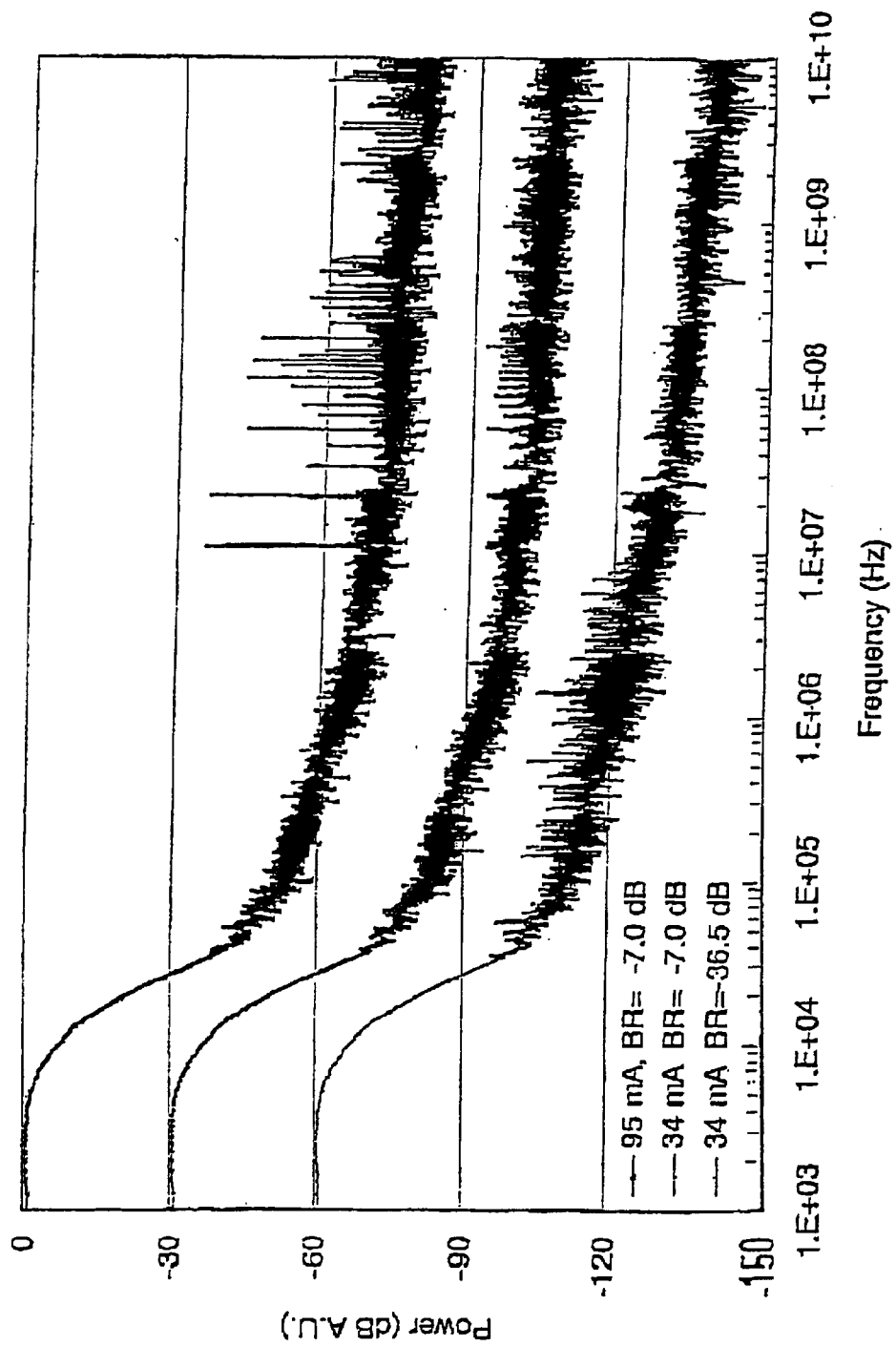
FIG. 11 shows the spectrum for a DFB module in isolator-free operation measured with an interferometer.

To examine the fine features in the CW spectrum at the discontinuity in the P-I curve, Module 1 was characterized by the self-homodyne method. The 5.2 km (26 microsecond) optical fiber delay path gives a 38 kHz resolution limit for the incoherent regime of interferometry. The three curves in FIG. 11 are offset by 30 dB for clarity. For the bottom curve, the laser was operated at 1 mW fiber power (34 mA) without an intentional back reflection. The device operated in a single longitudinal mode. For the middle trace, the laser was also operated at 1 mW, but with −7.0 dB back reflection, which corresponds to the stable region of the P-I curve. Under these conditions, external cavity modes at 11.4 MHz and 22.8 MHz are quite small relative to the main peak. Additional external cavity modes in the 50–300 MHz regime are also well suppressed. Because of the time averaging nature of the measurement, it was not clear if the side modes operate simultaneously with the main mode or represent transitions between adjacent external cavity modes. For the top curve, the laser was driven at 4.8 mW (97 mA) which is above the kink in the P-I graph. In this regime, the features at 11.4 MHz and 22.8 MHz are clearly visible indicating multiple external cavity modes. However, they are still well below the power level of the primary mode. Additional external cavity modes are visible up to several hundred megahertz from the peak. The expanded spectrum at 11.4 MHz revealed a 3 dB linewidth of several kHz, which supports the exceptional observation of a main peak linewidth more narrow than the resolution of the test equipment. A peak can also be seen at the relaxation oscillation frequency of the laser of 8 Ghz. For the conditions tested, the reflection sources is located well within the coherence length of the laser. Therefore, in the stable P-I regime, the laser is operating in a single external cavity mode. With large amounts of back reflection and above the P-I kink, several to many external cavity modes compete, although these devices do not fall into complete coherence collapse. However, the time averaged spectrum is effectively confined to several hundred megahertz.

Figure 12:
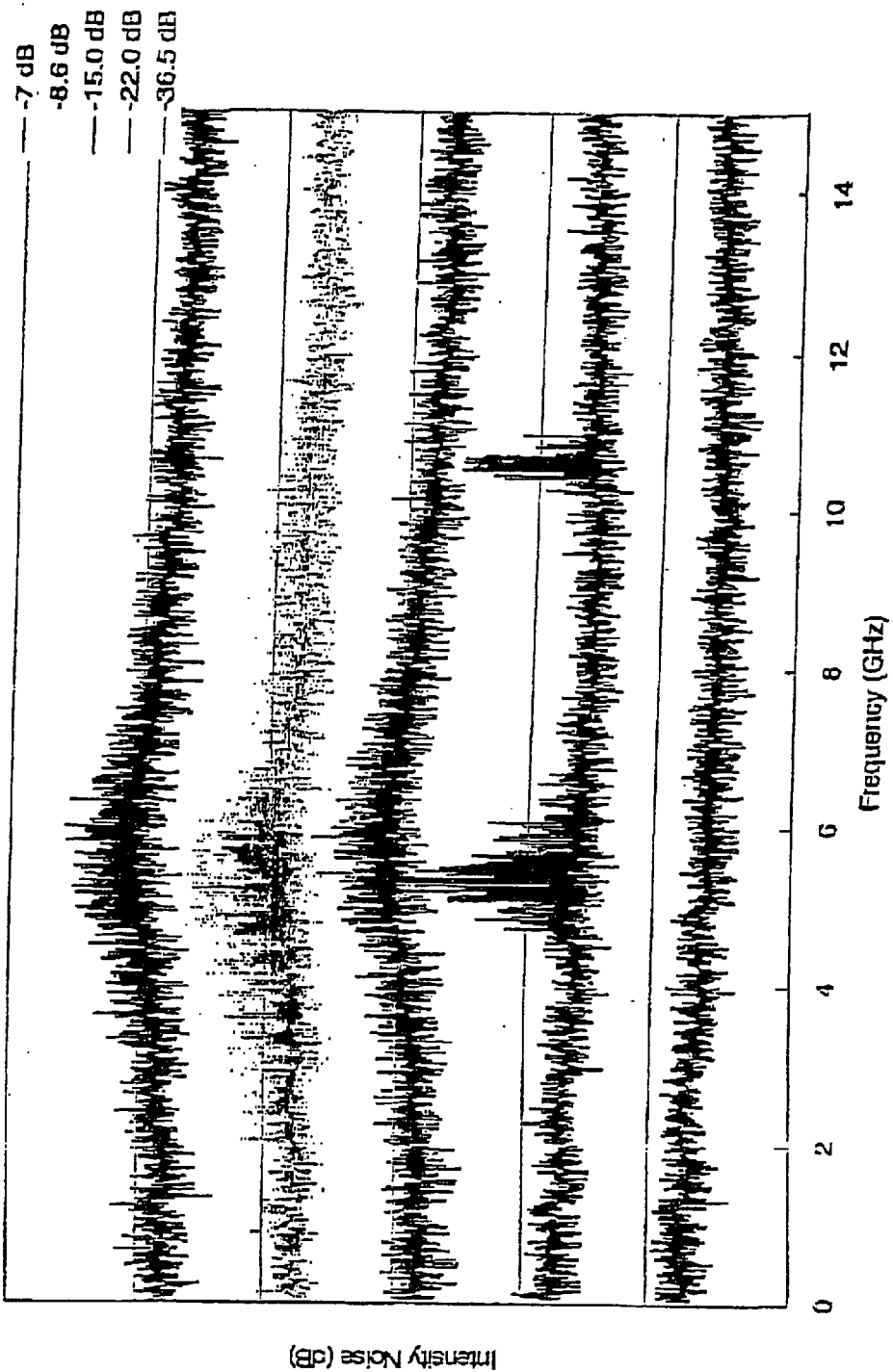
FIG. 12 shows the relative intensity noise (RIN) spectra for a DFB module in isolator-free operation at different optical feedback levels.
Figure 13:
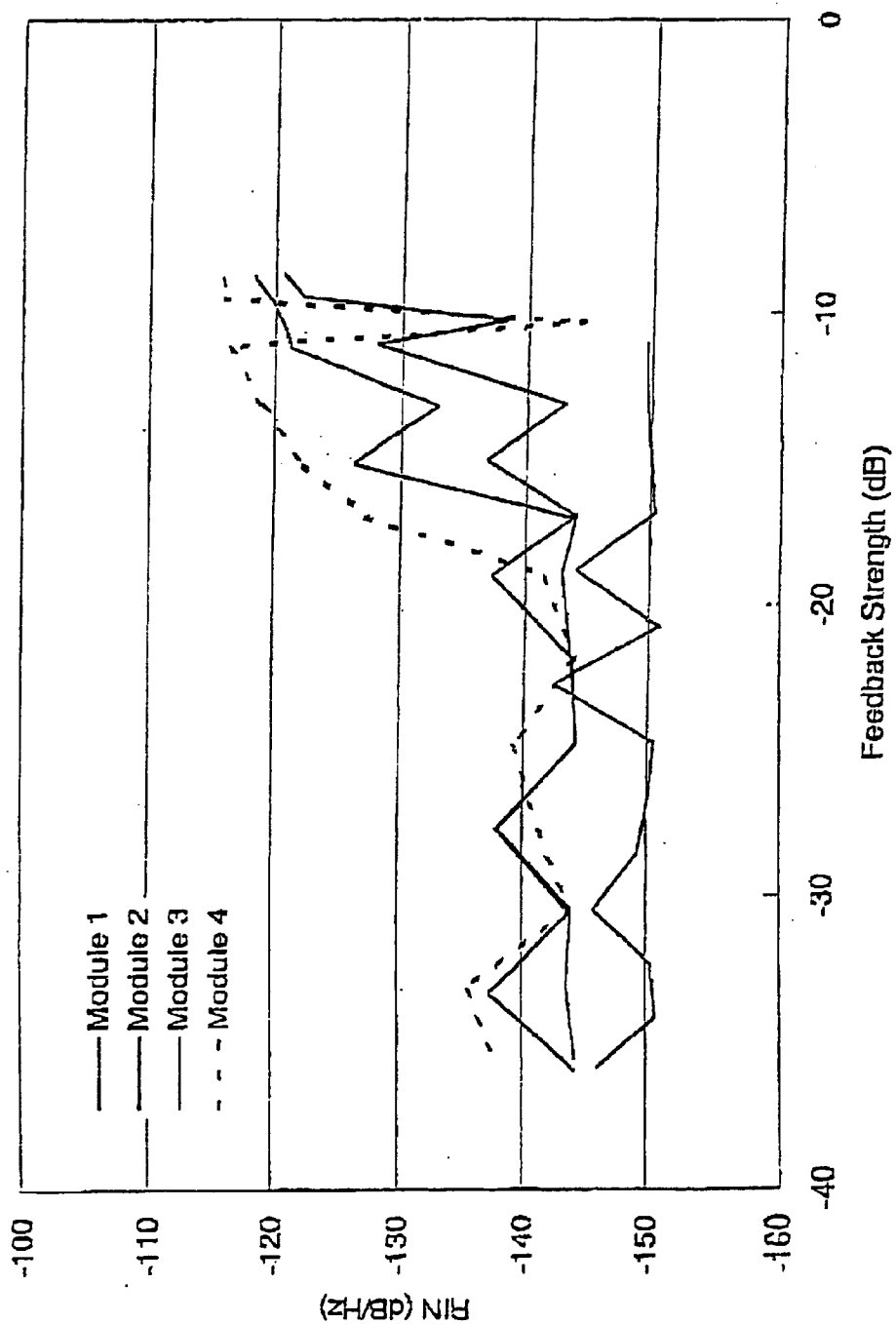
FIG. 13 shows the RIN for DFB modules in isolator-free operation at 1.8 Ghz plotted as a function of the optical feedback into the module.

FIG. 12 shows the relative intensity noise spectrums with −36.5, −22, −15, −8.6 and −7.0 dB of feedback into Module 4 operating at 1 mW. For very low back reflection levels, the intensity noise measured is limited by the sensitivity of the test system. However, at −22 dB of optical feedback, the relaxation oscillation and the first harmonic is visible at 5.4 GHz. At the resonance peak, fine oscillations spaced 11.4 MHz apart correspond to the mode spacing of the external fiber cavity. For systems operating at 2.5 Gb/s, low pass filters are used to eliminate wide band noise. Above −22 dB of optical feedback, the relaxation oscillation peak broadened, and the RIN increased. In FIG. 13, the RIN at 1.8 Ghz is plotted against the amount of feedback. With up to −20 dB back reflection, the RIN at 1.8 Ghz was comparable to devices with isolators.

The low frequency intensity noise reported in the literature of Fabry Perot diode lasers was not observed in FIG. 12. For Fabry Perot laser diodes, the low frequency noise is attributed to power drop events followed by multi-step return of power by individual steps with an interval set by the round trip time of the external cavity. The power increases and the spectral line decreases as the FP laser settles into the state with the most narrow linewidth. From FIG. 11, it can be seen that although the external cavity modes are only 11.5 MHz apart, very few can be sustained under CW operation. Since the grating limits multiple external cavity modes, intensity noise from external cavity mode competition is also avoided. Competition between modes can be promoted by increasing the length of the external cavity to decrease the frequency between modes. Preliminary data was taken with the back reflection source set 10.5 km away from the laser. Under these conditions, the low frequency RIN increased over the ground level by 10 dB with at a drive current of 40 mA. Because of the increased fiber losses, the power returning to the optical module was 4.3%.

Figure 14:
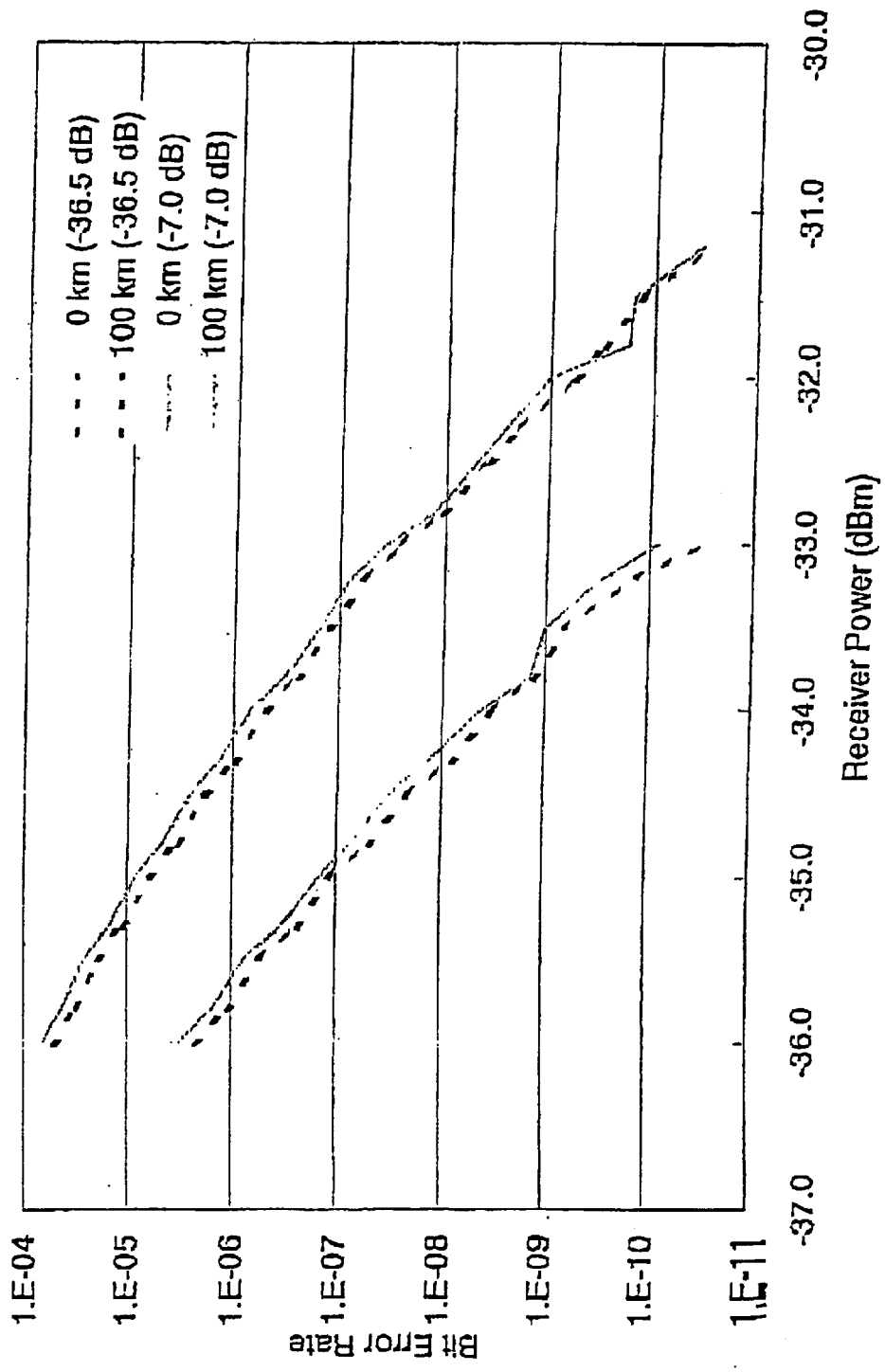
FIG. 14 shows bit error rate (BER) curves for a DFB module in isolator-free operation.

The bit error rate of 2.5 Gb/s under direct modulation was taken with varying amounts of optical feedback. The modules were tested with an average fiber power of 1.1 mW, an extinction ratio of 8.0 dB, a psuedo-random bit stream (PRBS) of $2^{23}-1$ and a chip temperature of 25° C. For transmission measurements over 100 km of SMF-28 fiber (dispersion D~17 ps/nm/km), the output from the directly modulated laser and back reflection set was boosted with an erbium-doped fiber amplifier (EDFA) to overcome fiber and coupling losses in the system, and detected with an avalanche photodiode (APD) receiver. FIG. 14 plots the error rate of Module 4 as a function of receiver signal with the minimum and maximum amount of feedback available with the test set-up. The effect of the feedback-induced RIN can be seen from the change in the 0 km receiver sensitivity. Measured at an error rate of $10^{-10}$ between the −36.5 dB and −7.0 dB back reflection conditions, the change of 0.2 dB is near the resolution of the test. The change in receiver sensitivity ($\delta_r$) as a function of the relative intensity noise and bandwidth (BW) is given by:

$$\delta_r = -10 Log_{10}(1 - RIN \times BW \times Q^2) \quad \text{(Eq. 1)}$$

For the group of modules tested, the observed degradation in 0 km sensitivity was as large as 0.4 dB with back reflections of −7.0 dB. The Q factor for these modules without any feedback is typically greater than 11 dB. These results are consistent with Equation 1 and the measured RIN of −115 dB/Hz with maximum feedback.

Figure 15:
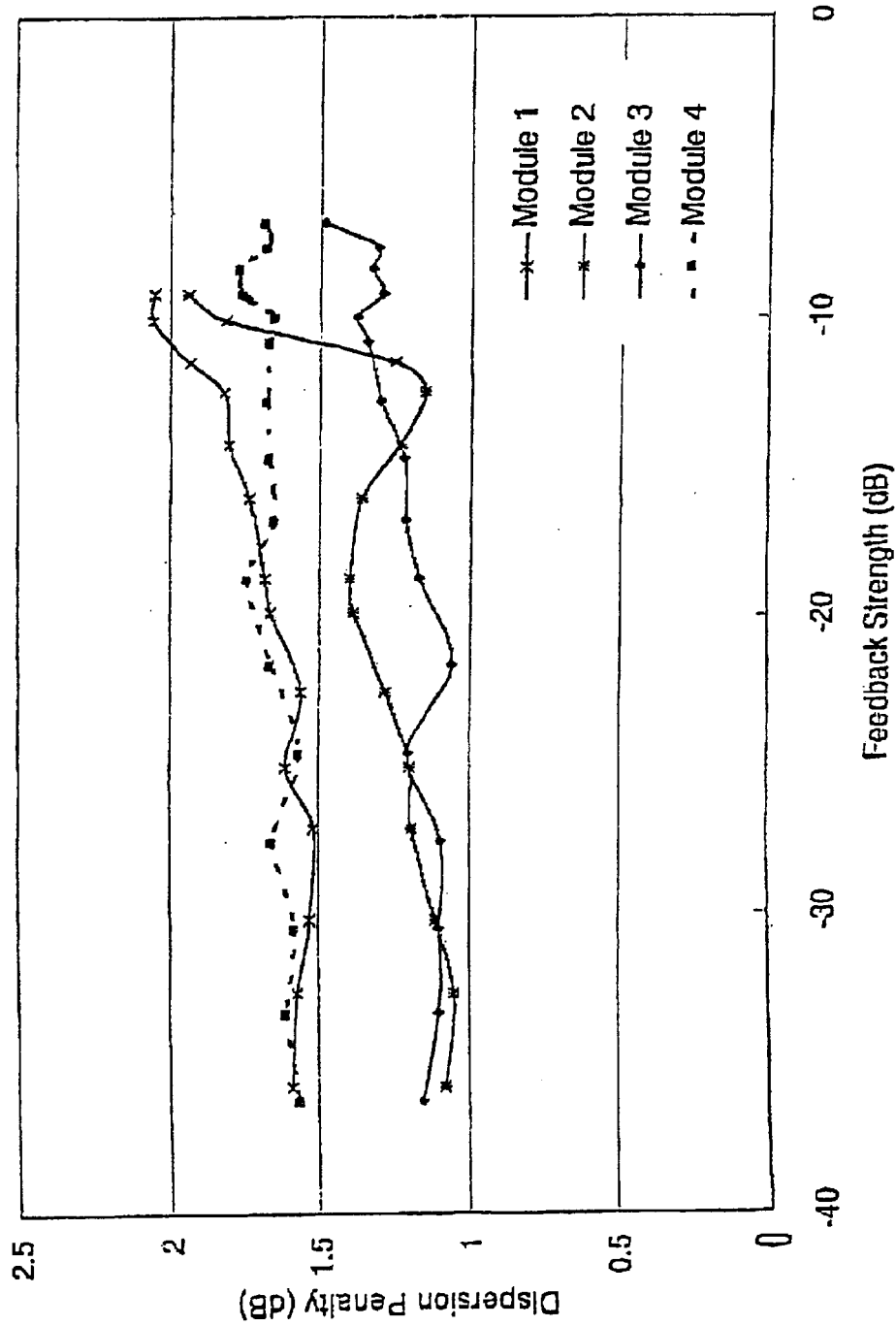
FIG. 15 shows dispersion penalty for DFB modules as a function of optical feedback into the module.

The dispersion penalty after 100 km of fiber is virtually unchanged with the module operating under −7.0 dB of back reflection as shown in FIG. 14. Even with large amounts of feedback, the side mode suppression ration in FIG. 9 is greater than 52 dB so error floors associated with sub-mode effects were avoided. The dispersion penalty is plotted as a function of back reflection in FIG. 15. For some modules, the dispersion penalty increases slightly under extreme back reflection suggesting modes spectral broadening. Equation 2 indicates the difference in propagation time for two adjacent modes of a cavity with optical length $n_{ext-cav}L_{ext-cav}$ over a fiber with dispersion D and length $L_{disp}$:

$$\tau_{disp} = L_{disp} D \Delta\lambda = D(\lambda^2/(2n_{ext\ cav}L_{ext\ cav})L_{disp} \quad \text{(Eq. 2)}$$

With the 8.7 m fiber external cavity used here the propagation delay after 100 km of fiber between adjacent modes will be less than 0.1 pS. Under dynamic operation, multiple external cavity modes may be excited. However, FIG. 11 suggests that the effective broadening caused by these back reflection sources will be contained by the grating spectral envelope. By minimizing reflection sources less than 1 meter from the laser, jumps between adjacent external cavity modes greater than 150 MHz can be avoided. Such mode hops will be small compared to data modulation line broadening. Close reflections can be minimized by coupling the light from the laser into a fiber with an antireflection coating, and setting a minimum length before a connector.

Semiconductor laser devices for high-speed data transmission applications without the use optical isolators are disclosed. By removing the isolator, the cost of producing these high-performance optical devices is reduced. Also, fabrication of devices using integrated optical combiners and other integrated optics is greatly simplified, and easier integration of optical components within a single module or on a monolithic chip is provided. The design and assembly of multiwavelength sources in a single compact module, for example, can be simplified if optical isolators are not required to prevent cross-talk.

Also, DFB laser diodes monolithically integrated with electroabsorption modulators usually require very good output faced antireflection coatings to prevent light from coupling back into the laser and generating undesirable chirp. However, the antireflection coating requirements may be relaxed if the DFB laser diode is resistant to the effects of optical feedback.

While this invention has been particularly shown and described with references to preferred embodiments thereof, it will be understood by those skilled in the art that various changes in form and details may be made therein without departing from the scope of the invention encompassed by the appended claims.

What is claimed is:

1. An integrated semiconductor device comprising:
   a semiconductor substrate;
   a laser on the substrate having an active layer and a periodically spaced current-induced grating disposed near the active layer, wherein the periodically spaced current-induced grating modulates gain in the active layer in the direction of light propagation for providing periodic modulation of the gain of the active layer and periodic modulation of a differential refractive index between the different indices of the active layer and of the periodically spaced current-induced grating to determine a wavelength of a light emitted from a laser cavity formed from the length L of the active layer, wherein the light emitted is a single-mode output light signal at a data rate greater than 622 Mb/sec in isolator-free operation; and
   an electrical contact over the periodically spaced current-induced grating for providing current to the grating to control the wavelength of the light emitted from the laser.

2. The semiconductor device of claim 1 wherein the grating comprises a strong complex-coupled grating having a coupling strength producing κL greater than 3, where κ is a coupling coefficient.

3. The semiconductor device of claim 2 wherein the grating comprises a first semiconductor material overgrown with a second semiconductor material.

4. The semiconductor device of claim 1 wherein the active layer comprises a multiple quantum well structure.

5. The semiconductor device of claim 4 wherein the multiple quantum well structure is AlInGaAs.

6. The semiconductor device of claim 1 wherein the electrical contact provides current to the grating at the data rate of at least 2.5 Gb/sec.

7. The semiconductor device of claim 1 further comprising a modulator on the substrate for modulating the output light.

8. The semiconductor device of claim 7 wherein the modulator comprises an electroabsorption modulator.

9. The semiconductor device of claim 7 wherein the modulator comprises a Mach Zehnder modulator.

10. The semiconductor device of claim 1 wherein the laser comprises a distributed feedback (DFB) laser.

11. A method for fabricating an integrated semiconductor device comprising:

forming on a semiconductor substrate an active layer; and forming a periodically spaced current-induced grating above the active layer, wherein the periodically spaced current-induced grating modulates gain in the active layer in the direction of light propagation for providing periodic modulation of the gain of the active layer and periodic modulation of a differential refractive index between the different indices of the active layer and of the periodically spaced current-induced grating to determine a wavelength of a light emitted from a laser cavity formed from the length L of the active layer, wherein the light emitted is a single-mode output light signal at a data rate greater than 622 Mb/sec. in isolator-free operation; and forming an electrical contact over the periodically spaced current-induced grating for providing current to the grating to control the wavelength of the light emitted from the laser.

12. The method of claim 11 wherein the output light has a wavelength of about 1.5 μm.

13. The method of claim 11 wherein the grating comprises a strong complex-coupled grating having a coupling strength product κL greater than 3, where κ is a coupling coefficient.

14. The method of claim 11 wherein the grating comprises a first semiconductor material overgrown with a second semiconductor material.

15. The method of claim 11 wherein the active layer comprises a multiple quantum well structure.

16. The method of claim 11 wherein the multiple quantum well structure is AlInGaAs.

17. The method of claim 11 further comprising forming a modulator on the substrate for modulating the output light.

18. The method of claim 17 wherein the modulator comprises an electroabsorption modulator.

19. The method of claim 17 wherein the modulator comprises a Mach Zehnder modulator.

20. An optical communication device comprising:

a semiconductor laser having an active layer and a periodically spaced current-induced grating disposed near the active layer, wherein the periodically spaced current-induced grating modulates pain in the active layer in the direction of light propagation for providing periodic modulation of the gain of the active layer and periodic modulation of a differential refractive index between the different indices of the active layer and of the periodically spaced current-induced grating to determine a wavelength of an output light emitted from a laser cavity formed from the length L of the active layer, wherein the output light is a single-mode output light signal at a data rate greater than 622 Mb/sec.

an electrical contact over the periodically spaced current-induced grating for providing current to the grating to control the wavelength of the output light emitted from the laser;

an optical fiber for receiving the output light; and optics for isolator-free coupling of the output light into the optical fiber.

21. The device of claim 20 wherein the output light has a wavelength of about 1.5 μm.

22. The device of claim 20 wherein the grating comprises a strong complex-coupled grating having a coupling strength product κL greater than 3, where κ is a coupling coefficient.

23. The device of claim 22 wherein the grating comprises a first semiconductor material overgrown with a second semiconductor material.

24. The device of claim 20 wherein the active layer comprises a multiple quantum well structure.

25. The device of claim 24 wherein the multiple quantum well structure is AlInGaAs.

26. The device of claim 20 wherein the electrical contact provides current to the grating at the data rate of at least 2.5 Gb/sec.

27. The device of claim 20 further comprising a modulator integrated with the laser for modulating the output laser light before coupling into the optical fiber.

28. The device of claim 27 wherein the modulator comprises an electroabsorption modulator.

29. The device of claim 27 wherein the modulator comprises a Mach Zehnder modulator.

30. The device of claim 20 wherein the laser comprises a distributed feedback (DFB) laser.

31. The device of claim 20 wherein the optics for isolator-free coupling comprise at least one lens disposed between the laser and the optical fiber.

32. The device of claim 31 wherein the optics for isolator-free coupling comprise at least two lenses disposed between the laser and the optical fiber, including a collimating lens and a coupling lens.

33. The device of claim 31, wherein the at least one lens comprises a fiber lens at an end of the fiber for receiving the output light.

\* \* \* \* \*